(12) United States Patent
Furue et al.

(10) Patent No.: US 7,893,600 B2
(45) Date of Patent: Feb. 22, 2011

(54) PIEZOELECTRIC RESONATOR

(75) Inventors: Junji Furue, Kirishima (JP); Masato Murahashi, Kirishima (JP); Yuuji Hata, Kirishima (JP)

(73) Assignee: Kyocera Corporation, Kyoto (JP)

( * ) Notice: Subject to any disclaimer, the term of this patent is extended or adjusted under 35 U.S.C. 154(b) by 248 days.

(21) Appl. No.: 12/064,949

(22) PCT Filed: Aug. 31, 2005

(86) PCT No.: PCT/JP2005/015932

§ 371 (c)(1),
(2), (4) Date: Feb. 26, 2008

(87) PCT Pub. No.: WO2007/026428

PCT Pub. Date: Mar. 8, 2007

(65) Prior Publication Data

US 2009/0045695 A1 Feb. 19, 2009

(51) Int. Cl.
*H01L 41/08* (2006.01)
(52) U.S. Cl. ..................................................... 310/344
(58) Field of Classification Search ................. 310/340, 310/344
See application file for complete search history.

(56) References Cited

U.S. PATENT DOCUMENTS

| | | | |
|---|---|---|---|
| 5,623,236 A * | 4/1997 | Yoshinaga et al. | 333/187 |
| 6,274,968 B1 * | 8/2001 | Wajima et al. | 310/348 |
| 6,448,696 B2 * | 9/2002 | Wajima et al. | 310/344 |
| 6,531,806 B1 * | 3/2003 | Daidai | 310/344 |
| 6,744,179 B2 * | 6/2004 | Wajima et al. | 310/344 |
| 7,034,441 B2 * | 4/2006 | Ono et al. | 310/344 |
| 7,282,835 B2 * | 10/2007 | Kawakami | 310/313 A |
| 2006/0250049 A1 * | 11/2006 | Park et al. | 310/344 |

FOREIGN PATENT DOCUMENTS

| | | |
|---|---|---|
| JP | 64-025228 | 2/1989 |
| JP | 03-247010 | 11/1991 |
| JP | 05-145366 | 6/1993 |
| JP | 05145366 A | 6/1993 |
| JP | 06-140868 | 5/1994 |
| JP | 6140868 A | 5/1994 |
| JP | 08-065085 | 3/1996 |
| JP | 2001-102892 | 4/2001 |
| JP | 2001102892 A | 4/2001 |
| JP | 2001177369 A | 6/2001 |

OTHER PUBLICATIONS

Japanese language office action dated Sep. 7, 2010 and its English language translation for corresponding Japanese application 2005051975 lists the references above.

* cited by examiner

*Primary Examiner*—Mark Budd
(74) *Attorney, Agent, or Firm*—DLA Piper LLP (US)

(57) ABSTRACT

A capacitor-built-in type piezoelectric resonator which is thin and small in size, and has high reliability is formed by forming a pair of vibrating electrodes on both principal surfaces of a piezoelectric substrate, and joining a sealing substrate made of a ceramic material to form a capacitance via a frame onto one vibrating electrode, and joining a sealing substrate made of a resin material via a frame onto the other vibrating electrode.

1 Claim, 8 Drawing Sheets

PIEZOELECTRIC RESONATOR

TECHNICAL FIELD

The present invention relates to a piezoelectric resonator to be used for an oscillating circuit, a filter circuit, or the like.

BACKGROUND ART

As a conventional piezoelectric resonator, for example, the capacitor-built-in type piezoelectric resonator shown in FIG. 8 is known (for example, refer to Patent document 1 listed below). The capacitor-built-in type piezoelectric resonator shown in FIG. 8 is structured so that vibrating electrodes 102 are provided on both principal surfaces of a piezoelectric substrate 101, and a pair of sealing substrates 103 are joined to the piezoelectric substrate 101 via a pair of frames 104 made of a resin material so as to surround the respective vibrating electrodes 102.

The piezoelectric substrate 101 is made of a piezoelectric ceramic material, and constitutes a piezoelectric resonant element by being provided with vibrating electrodes 102 on both principal surfaces. The sealing substrate 103 is made of a ceramic material, and forms a capacitance by means of electrodes provided on upper and lower surfaces thereof. In detail, a capacitance is generated via the sealing substrate 103 between an outer terminal electrode 109 and an inner electrode 106 provided on outside surfaces of the sealing substrate 103, between the outer terminal electrode 109 and a portion of an outer terminal electrode 107 extending to the principal surface of the sealing substrate 103, and between the outer terminal electrode 109 and a portion of an outer terminal electrode 108 extending to the principal surface of the sealing substrate 103.

Such a capacitor-built-in type piezoelectric resonator is produced by coating a frame 104 made of uncured resin onto the upper and lower surfaces of the piezoelectric substrate 101 so as to surround vibrating regions of the vibrating electrodes 102, and thereafter, placing the sealing substrates 103 on the frames 104 and then curing the frames 104. This capacitor-built-in type piezoelectric resonator is thinned by setting the heights of the vibration spaces 105 equal to the thickness of the frames 104.

Patent document 1: Japanese Unexamined Patent Publication No. 03-247010 (1991)

DISCLOSURE OF THE PRESENT INVENTION

Problems to be Solved by the Invention

However, the thinner the frames 104 are, the narrower the distance between the vibrating electrode 102 and the sealing substrate 103 is. Therefore, due to slight deformation of the sealing substrate 103, the piezoelectric substrate 101 and the like, the vibrating electrode 102 and the sealing substrate 103 more easily come into contact with each other. Therefore, the frame 104 cannot be made thinner than necessary.

Therefore, to realize an even thinner piezoelectric resonator, a method in which the sealing substrate 103 is made thinner may be possible. However, in the conventional capacitor-built-in type piezoelectric resonator, the pair of sealing substrates 103 are made of a ceramic material, so that when the planar sealing substrates 103 is formed or the capacitor-built-in type piezoelectric resonator is mounted, the sealing substrates 103 are easily broken or cracked. In particular, as the sealing substrates 103 are made thinner, the above-described problem more easily occurs. Therefore, production of thin sealing substrates 103 with a satisfactory yield is limited, which greatly hinders reduction in thickness of the capacitor-built-in type piezoelectric resonator.

The present invention is made in view of the above-described problems, and a main object thereof is to provide a piezoelectric resonator suitable to for thinning.

To achieve the above-described object, a piezoelectric resonator of the present invention includes a piezoelectric substrate having first and second principal surfaces, a first vibrating electrode formed on a first principal surface of the piezoelectric substrate, a second vibrating electrode formed on a second principal surface of the piezoelectric substrate, a first sealing substrate joined to the piezoelectric substrate via a first frame so as to form a first vibration space on a first principal surface side of the piezoelectric substrate, and a second sealing substrate joined to the piezoelectric substrate via a second frame so as to form a second vibration space on a second principal surface side of the piezoelectric substrate, wherein the first sealing substrate is made of a ceramic material, and the second sealing substrate is made of a resin material.

In the piezoelectric resonator of the present invention, the second sealing substrate contains glass fibers.

In the piezoelectric resonator of the present invention, the second frame is made of a resin material similar to the resin material forming the second sealing substrate.

In the piezoelectric resonator of the present invention, the ceramic material forming the first sealing substrate has a specific permittivity of 200 to 5000, and a capacitance-forming outer terminal electrode is provided on an outside surface of the first sealing substrate.

In the piezoelectric resonator of the present invention, a resin layer is interposed between the first sealing substrate and the first frame.

In the piezoelectric resonator of the present invention, the resin layer is made of the resin material forming the second sealing substrate, and a thickness of the second sealing substrate and a thickness of the resin layer are substantially equal to each other.

In the piezoelectric resonator of the present invention, the second sealing substrate side is defined as a mounting surface.

Effects of the Invention

According to the piezoelectric resonator of the present invention, forming the second sealing substrate of a resin material, in comparison with a sealing substrate made of a ceramic material, can effectively prevent generation of breakage and cracks when it is thinned. Therefore, a piezoelectric resonator which is excellent in mechanical strength and suitable for thinning is obtained.

In the piezoelectric resonator of the present invention, it is preferable that glass fibers are contained in the second sealing substrate. A glass material does not have fluidity at a considerably high temperature of several hundred degrees centigrade, so that it does not deform at the glass transition temperature of the resin material. Therefore, by containing glass fibers in the second sealing substrate, the glass fibers serve as a hard frame and can prevent thermal deformation of the second sealing substrate. The second sealing substrate thus can be prevented from thermally deforming, so that contact between the second sealing substrate and the piezoelectric substrate can be effectively prevented.

In the piezoelectric resonator of the present invention, it is preferable that the second frame is formed by means of a resin material similar to the resin material forming the second sealing substrate. In this case, the adhesion between the second sealing substrate and the second frame is improved and the joining strength there between can be improved.

In the piezoelectric resonator of the present invention, it is preferable that the ceramic material forming the first sealing substrate has a specific permittivity of 200 to 5000, and a capacitance-forming outer terminal electrode is provided on the outside surface of the first sealing substrate. By using a ferroelectric ceramic material as the material of the first sealing substrate as described above, a comparatively large capacitance can be easily formed. By using a ceramic material as the material of the first sealing substrate, the strength against stresses or the like from the outside can be improved and stresses to be applied to the piezoelectric substrate can be reduced. Accordingly, even if a stress by an impact or the like from the outside is applied to the piezoelectric resonator, the piezoelectric substrate is effectively prevented from breakage, so that a piezoelectric resonator with excellent reliability can be obtained.

In the piezoelectric resonator of the present invention, a resin layer can be interposed between the first sealing substrate and the first frame. In this case, the first sealing substrate and the first frame are firmly bonded to each other by means of the resin layer, so that the mechanical strength of the piezoelectric resonator can be improved.

In the piezoelectric resonator of the present invention, it is preferable that the resin layer is made of the resin material forming the second sealing substrate, and the thickness of the second sealing substrate and the thickness of the resin layer are substantially equal to each other. Accordingly, the degrees of absorbing a stress from the outside are approximated to each other between the resin layer and the second sealing substrate, so that the stresses applied to the upper and lower surfaces of the piezoelectric substrate become substantially uniform. As a result, undesired distortion of the piezoelectric substrate is prevented, and excellent electrical characteristics of the piezoelectric resonator can be maintained.

In the piezoelectric resonator of the present invention, the second sealing substrate side may be defined as a mounting surface. In this case, the second sealing substrate side made of a resin material which is softer and more easily deformed than the sealing substrate made of a ceramic material is mounted on an external wiring substrate. Therefore, a stress caused at mounting due to differences in the thermal expansion coefficient and elastic modulus from the wiring substrate is absorbed by deformation of the second sealing substrate, and generation of cracks or the like around the mounting surface can be effectively prevented.

DESCRIPTION OF THE REFERENCE NUMERALS

Figure 1:
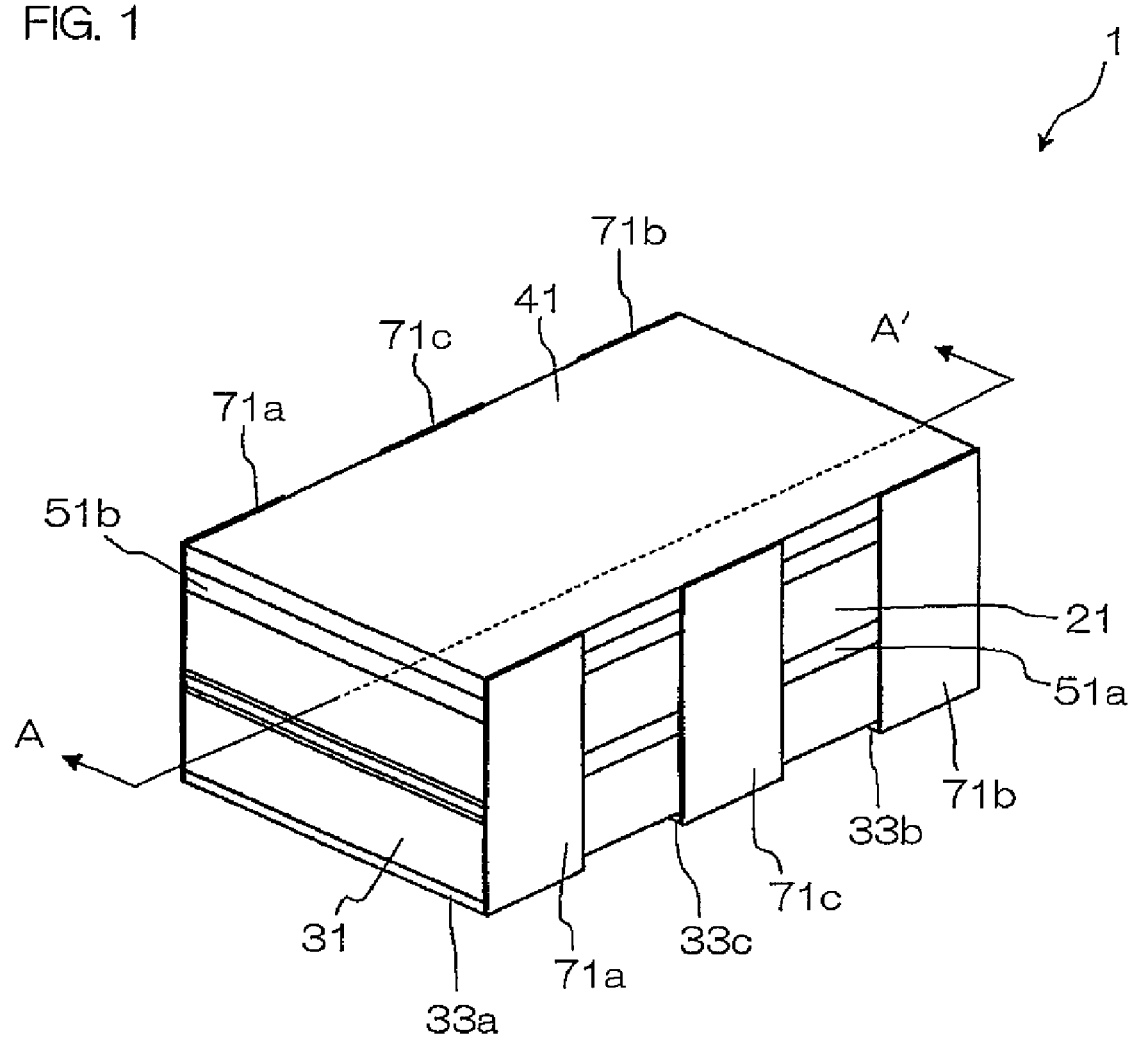
FIG. 1 is a perspective view schematically showing an example of a piezoelectric resonator of the present invention.

1: piezoelectric resonator
21: piezoelectric substrate
22a: first vibrating electrode
22b: second vibrating electrode
31: first sealing substrate
41: second sealing substrate
32a, 32b: inner electrode
33a, 33b, 33c: outer terminal electrode
51a: first frame
51b: second frame
61a: first vibration space
61b: second vibration space
71a, 71b, 71c: outer connecting electrode
81: resin layer

EMBODIMENT OF THE INVENTION

Hereinafter, a piezoelectric resonator of the present invention will be described in detail with reference to the accompanying drawings.

Figure 2:
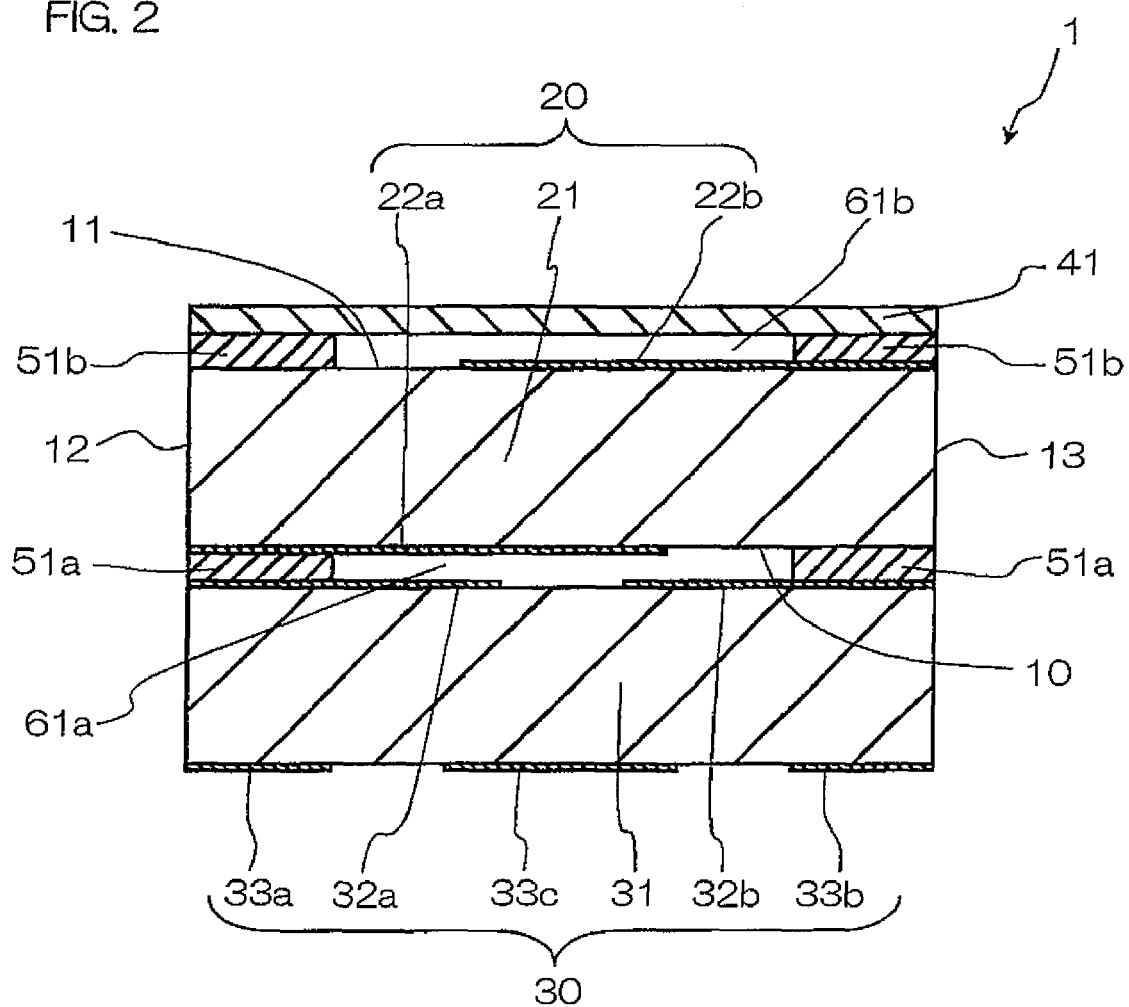
FIG. 2 is a sectional view along the A-A' line of FIG. 1.
Figure 3:
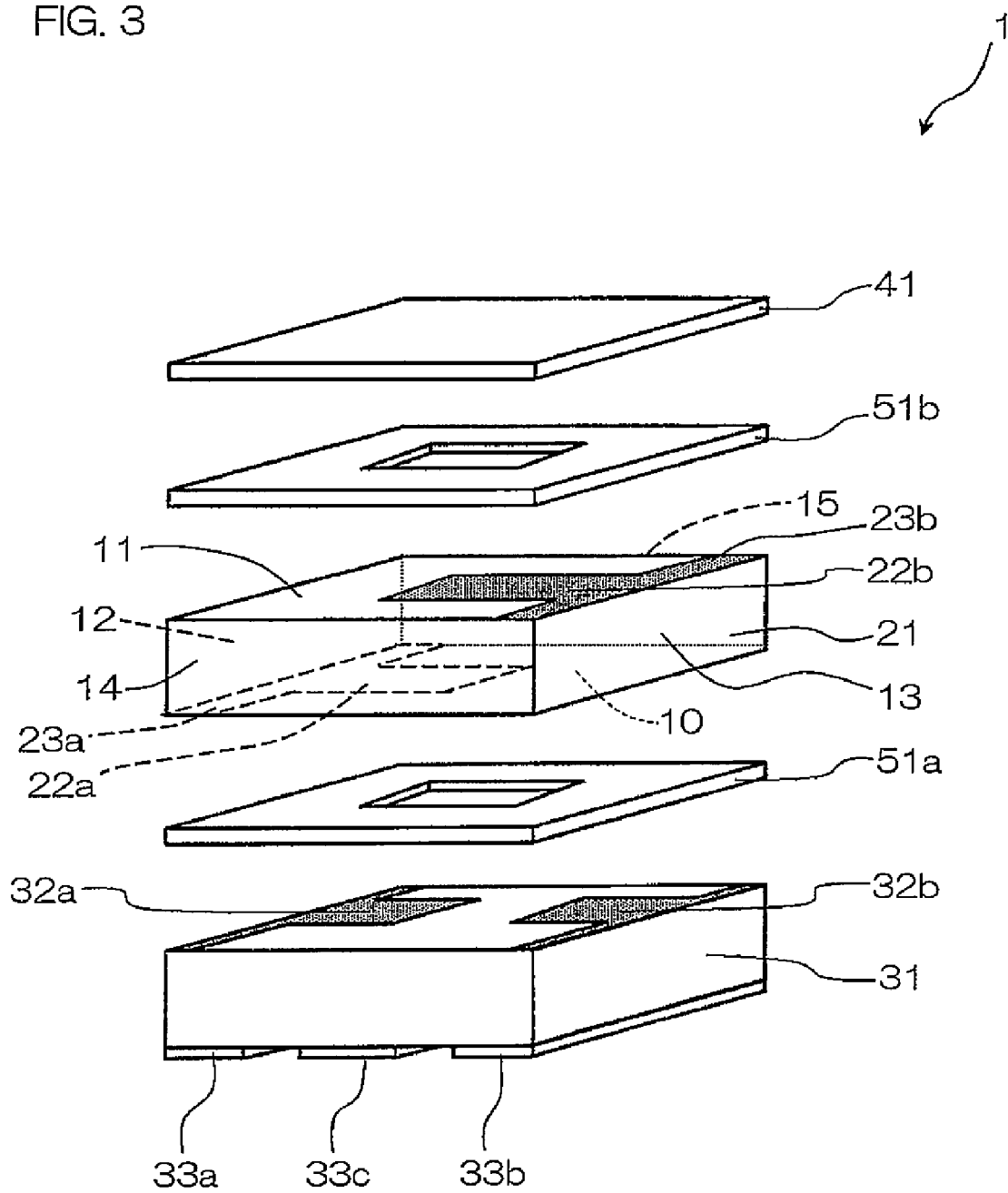
FIG. 3 is an exploded perspective view schematically showing the piezoelectric resonator of the present invention.

FIG. 1 is an external perspective view schematically showing an example of the piezoelectric resonator of the present invention, FIG. 2 is a sectional view along the A-A' line thereof, and FIG. 3 is an exploded perspective view.

In this embodiment, a piezoelectric resonator of a type with a built-in capacitor will be described.

The piezoelectric resonator 1 shown in the figures is mainly formed with one piezoelectric substrate 21 and two sealing substrates 31 and 41. In detail, as shown in FIG. 2, the first sealing substrate 31 is joined to the piezoelectric substrate 21 via a first frame 51a so that a first vibration space 61a is formed on the first principal surface 10 side of the piezoelectric substrate 21, and the second sealing substrate 41 is joined to the piezoelectric substrate 21 via a second frame 51b so that a second vibration space 61b is formed on the second principal surface 11 side of the piezoelectric substrate 21.

The piezoelectric substrate 21 is a substrate in a quadrilateral shape having a length and width of several millimeters and a thickness of several tens of micrometers to several millimeters, made of a piezoelectric ceramic material such as lead zirconate titanate (PZT), lead titanate (PT), or a piezoelectric single-crystal material such as crystallized quartz ($SiO_2$) or lithium niobate ($LiNbO_3$). When the piezoelectric substrate 21 is made of a ceramic material, it is formed according to a method in which a binder is added to a raw material powder and pressed, or a method in which a raw material powder is mixed with water and a dispersant using a ball mill and then dried, and added with a binder, a solvent, a plasticizer and the like, and then molded into a sheet according to a doctor blade method. Then the sheet is baked for several tens of minutes to several hours at a peak temperature of 1100 to 1400° C. to form a substrate, and thereafter, the substrate is imparted with desired piezoelectrical characteristics through polarization, for example, by applying a voltage of 3 to 15 kV/mm at a temperature of 60 to 150° C. in the thickness direction. When the piezoelectric substrate 21 is made of a piezoelectric single-crystal material, an ingot (base material) of the piezoelectric single-crystal material to be formed into the piezoelectric substrate 21 is cut so as to have a predetermined crystal direction, whereby a piezoelectric substrate 21 with desired piezoelectrical characteristics can be obtained.

On both principal surfaces of this piezoelectric substrate 21, first and second vibrating electrodes 22a and 22b are deposited and formed. In detail, the first vibrating electrode 22a is formed on the first principal surface 10 of the piezoelectric substrate 21, and the second vibrating electrode 22b is formed on the second principal surface 11 of the piezoelectric substrate 21. The first vibrating electrode 22a and the second vibrating electrode 22b are arranged substantially parallel to each other across the piezoelectric substrate 21, and these piezoelectric substrate 21, first vibrating electrode 22a, and second vibrating electrode 22b constitute a piezoelectric resonant element 20 which resonates at a specific frequency.

The first and second vibrating electrodes 22a and 22b are made of a metal having excellent conductivity such as gold, silver, copper, chromium, nickel, tin, lead, and aluminum, and are formed by a PVD method such as vacuum vapor deposition, a sputtering method, or coating and baking according to a thick-film printing method. A metal such as chromium having excellent adhesion to a ceramic material may be deposited in advance on the piezoelectric substrate 21 to deposit the metal thereon.

The first and second vibrating electrodes 22a and 22b are processed into a predetermined shape such as a circular shape or a quadrilateral shape. In the case of the circular shape, its diameter is, for example, not less than 50 μm and not more than the length of the shorter side of the length and width of the piezoelectric substrate. In the case of the quadrilateral shape, the length and width thereof are set to, for example, 50 μm to 2 mm. The thickness of the first and second vibrating electrodes 22a and 22b are set to, for example, 0.5 μm to 30 μm. Further, the size, arrangement, and thickness of the individual vibrating electrodes 22a and 22b are arbitrarily determined according to desired electrical characteristics such as the resonance characteristics and resonance frequency.

As shown in FIG. 3, the first vibrating electrode 22a is formed in the central region of the first principal surface 10 of the piezoelectric substrate 21, and drawn from the central region toward the left side surface 12 of the piezoelectric substrate 21, and connected to a drawn portion 23a formed along an edge between the left side surface 12 and the first principal surface 10 of the piezoelectric substrate 21.

The drawn portion 23a is exposed to the front side surface 14 and the side surface 15 opposite to the front side surface 14 of the piezoelectric substrate 21. Then, as shown in FIG. 1, the exposed portion of the drawn portion 23a is connected to the outer connecting electrode 71a.

Additionally, the second vibrating electrode 22b is formed in the central region of the second principal surface 11 of the piezoelectric substrate 21 so as to overlap with the first vibrating electrode 22a via the piezoelectric substrate 21 in the directions of the principal surfaces 10 and 11 of the piezoelectric substrate 21, drawn from the central region toward the right side surface 13 of the piezoelectric substrate 21, and connected to a drawn portion 23b formed along an edge between the right side surface 13 and the second principal surface 11 of the piezoelectric substrate 21.

The drawn portion 23b is exposed to the front side surface 14 and the side surface 15 opposite to the front side surface 14 of the piezoelectric substrate 21. Then, as shown in FIG. 1, the exposed portion of the drawn portion 23b is connected to the outer connecting electrode 71b.

The first and second vibrating electrodes 22a and 22b may be divided electrodes formed with a plurality of electrodes on both the principal surfaces 10 and 11 of the piezoelectric substrate 21.

The first sealing substrate 31 is joined to the first principal surface 10 side of the piezoelectric substrate 21 via a first frame 51a so as to form a first vibration space 61a. On the other hand, the second sealing substrate 41 is joined to the second principal surface 11 side of the piezoelectric substrate 21 via a second frame 51b so as to form a second vibration space 61b.

The first sealing substrate 31 forms the vibration space 61a in combination with the first frame 51a and has a function of protecting the piezoelectric substrate 21 from external force. Such first sealing substrate 31 is made of a ferroelectric ceramic material such as lead zirconate titanate (PZT), lead titanate (PT), or barium titanate (BT). The substrate is in a rectangular parallelepiped shape having a length and width substantially equal to those of the piezoelectric substrate 21 and a thickness of several tens of micrometers to 1 mm. This first sealing substrate 31 is formed according to a method in which a raw material powder is added with a binder and pressed, or a method in which a raw material powder is mixed with water and a dispersant using a ball mill and dried, and added with a binder, a solvent, a plasticizer and the like, and then molded into a sheet according to a doctor blade method. Then this sheet is baked for several tens of minutes to several hours at a peak temperature of 1100 to 1400° C. Herein, by using a ferroelectric ceramic material such as lead zirconate titanate (PZT), lead titanate (PT) or barium titanate (BT) as the material of the first sealing substrate 31, the specific permittivity of the first sealing substrate 31 can be increased, so that a capacitor element 30 having a sufficiently large capacitance can be constituted. It is desirable that the specific permittivity of the first sealing substrate 31 is set to 200 to 5000.

By using a ceramic material as the material of the first sealing substrate 31, the strength against stress from the outside can be improved and stress to be applied to the piezoelectric substrate 21 can be reduced. Accordingly, even if a stress of an impactor the like is applied to the piezoelectric resonator 1, breakage of the piezoelectric substrate 21 is effectively prevented, and a piezoelectric resonator having excellent reliability can be obtained.

Figure 4:
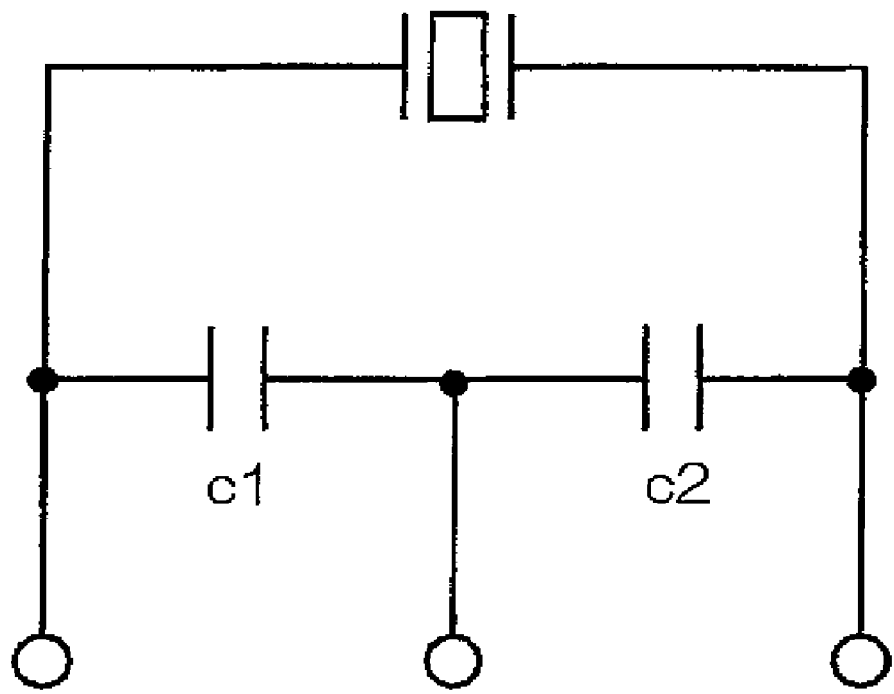
FIG. 4 is a diagram showing an equivalent circuit of the piezoelectric resonator of the present invention.

On the upper surface of the first sealing substrate 31, inner electrodes 32a and 32b are formed, and on the lower surface of the first sealing substrate 31, outer terminal electrodes 33a, 33b and 33c are individually formed. The inner electrodes 32a and 32b and the outer terminal electrodes 33a, 33b and 33c constitute a capacitor element 30 in combination with the first sealing substrate 31. In detail, a capacitance cl is formed between the outer terminal electrodes 33a and 33c, and a capacitance c2 is formed between the outer terminal electrodes 33b and 33c, respectively (FIG. 4).

Such inner electrodes 32a and 32b, and outer terminal electrodes 33a, 33b, and 33c are formed of the same material and the same method as those of the vibrating electrode 22. The outer terminal electrodes 33a, 33b, and 33c are used for further mechanical connection and electrical connection to an external mounting substrate on which the piezoelectric resonator 1 is mounted, and their surfaces are plated with Ni—Sn.

On the other hand, the second sealing substrate 41 forms a second vibration space 61b in combination with the second frame 51b, and has a function of protecting a vibration region on the upper surface side of the piezoelectric substrate 21.

The length and width of the second sealing substrate 41 are substantially the same as those of the piezoelectric substrate 21, and the thickness thereof is several tens of micrometers to several millimeters although this depends on the material. As a material of this second sealing substrate 41, engineering plastic such as polybutylene terephthalate (PBT) or liquid crystal polymer, or a heat-resistant resin such as polyimide resins or epoxy resins can be used.

By forming the second sealing substrate 41 of a resin material, the second sealing substrate 41 can be made thinner than the sealing substrate made of a ceramic material. In addition, in comparison with the sealing substrate made of a ceramic material, when the substrate is thinned, breakage and cracks can be effectively prevented. Therefore, a piezoelectric resonator 1 which is excellent in mechanical strength and suitable for thinning is obtained.

It is preferable that glass fibers are contained in the second sealing substrate 41. By using a resin material containing glass fibers, thermal deformation of the sealing substrate 41 can be prevented, and vibration spaces 61a and 61b can be easily formed.

When the second sealing substrate 41 is formed of a ceramic substrate similar to that of the first sealing substrate 31, its thickness is limited up to 150 μm due to a problem in strength such as a structural defect of ceramic.

However, by making the second sealing substrate 41 of a resin material containing glass fibers, its thickness can be reduced to 28 μm. Accordingly, the piezoelectric resonator 1 can be thinned.

As a resin material to form the second sealing substrate 41, epoxy resins or polyimide resins are preferable. For example, when 30 to 80% of glass fibers are contained in the polyimide resins sheet or epoxy resins sheet, a second substrate 41 which is formed by holding the sheet for 40 to 90 minutes at 180 to 200° C. for curing under a pressure of 0.2 to 5 MPa in vacuum of 100 Pa or less can be satisfactorily joined to the piezoelectric substrate 21 by sandwiching a second frame 51b between the second substrate 41 and the piezoelectric substrate 21 and curing the frame 51b by heating. In the experiment conducted by the inventors, when polyimide resins having a glass fiber content of 32% was used, the deformation (warping) due to heating at the joining mentioned above could be reduced to about 40% of the deformation of the second sealing substrate 41 made of polyimide resins containing no glass fibers.

By thus suppressing deformation of the second sealing substrate 41, when the second sealing substrate 41 is joined to the piezoelectric substrate 21 by heating adhesion via the second frame 51b, the second sealing substrate 41 can be effectively prevented from falling over to the piezoelectric substrate 21 side and coming into contact with the second vibrating electrode 22b. Accordingly, the second frame 51b can be made thinner, and as a result, the entire thickness of the piezoelectric resonator can be further reduced. Further, a resin sheet before being cured may be laminated on the second frame 51b and both are simultaneously cured to form the second sealing substrate 41, and the second sealing substrate 41 is joined to the piezoelectric substrate 21 by heating adhesion via the second frame 51b.

The first frame 51a and the second frame 51b for joining the above-described first sealing substrate 31 and second sealing substrate 41 to the piezoelectric substrate 21 and forming the first and second vibration spaces 61a and 61b will be described. Such first and second frames 51a and 51b are made of a thermosetting resin such as epoxy resins, and is coated according to thick-film printing and dried and cured at 80 to 200° C. after the first and second sealing substrates 31 and 41 are overlaid thereon, and joins the first and second sealing substrates 31 and 41 to the piezoelectric substrate 21 by heating adhesion. The epoxy resins after being cured has a three-dimensional fine mesh structure, so that it is excellent in airtightness, and can seal airtightly the vibration spaces 61a and 61b for a long period of time.

A filler made of ceramics such as silicon oxide may be contained in the first and second frames 51a and 51b. Accordingly, the viscosities and thermal expansion coefficients of the first and second frames 51a and 51b can be adjusted. By adjusting the heights of the first and second frames 51, the distance between the first vibrating electrode 22a and the first sealing substrate 31, or the distance between the second vibrating electrode 22b and the second sealing substrate 41 can be adjusted. The distances between the vibrating electrodes 22a and 22b, and the sealing substrates 31 and 41 are preferably set to 5 μm to 100 μm, and more preferably set to 20 μm to 60 μm. If the distances between the vibrating electrodes 22a and 22b, and the sealing substrates 31 and 41 are less than 20 μm, when an undesired external force is applied to the piezoelectric resonator 1, the sealing substrates 31 and 41 warp and easily come into contact with the vibrating electrodes 22a and 22b to increase the risk of damping the vibration of the piezoelectric resonator 20. On the other hand, if the distances between the vibrating electrodes 22a and 22b, and the sealing substrates 31 and 41 are more than 60 μm, the piezoelectric resonator 1 becomes thicker than necessary to tend toward difficulties in reducing the thickness the piezoelectric resonator.

The second frame 51b is preferably made of a resin material similar to that of the second sealing substrate 41. By making the second frame 51b of a resin material similar to that of the second sealing substrate 41, the adhesion between the second sealing substrate 41 and the second frame 51b is improved, and the joining strength there between can be improved. In greater detail, it is preferable that the second sealing substrate 41 and the second frame 51b are made of epoxy resins or polyimide resins.

When the first and second frames 51a and 51b are made of the same material, the steps of coating the individual frames 51a and 51b can be integrated. Accordingly, the number of steps can be reduced, and this contributes to improvement in productivity. The vibrations spaces 61a and 61b may be formed in vacuum and the vibrating electrodes 22a and 22b may be sealed also in vacuum. In this case, oxidation corrosion of the vibrating electrodes 22 and 22b is prevented to obtain a piezoelectric resonator 1 with higher reliability.

The side surfaces of the piezoelectric resonator 1 is formed with an outer connecting electrode 71a which electrically connects the first vibrating electrode 22a, the inner electrode 32a, and the outer terminal electrode 33a, an outer connecting electrode 71b which electrically connects the second vibrating electrode 22b, the inner electrode 32b, and the outer terminal electrode 33b, and an outer connecting electrode 71c which is connected to the outer terminal electrode 33c.

Further, a capacitance c1 is formed between the outer terminal electrodes 33a and 33c, and a capacitance c2 is formed between the outer terminal electrode 33b and 33c, respectively. The first vibrating electrode 22a, the inner electrode 32a, and the outer terminal electrode 33a are connected by the outer connecting electrode 71a, and the second vibrating electrode 22b, the inner electrode 32b, and the outer terminal electrode 33b are connected by the outer connecting electrode 71b, and furthermore, the outer terminal electrode 33c is connected to the outer connecting electrode 71c, whereby the piezoelectric resonant element 20 and the capacitor element 30 are electrically connected to each other to constitute the equivalent circuit shown in FIG. 4.

These outer connecting electrodes 71a, 71b, and 71c are formed by depositing a metal having excellent conductivity such as gold, silver, copper, chromium, nickel, tin, lead, or aluminum by a PVD method such as vacuum vapor deposition or a sputtering method, or coating conductive epoxy resins by thick-film printing, and curing it at 80 to 250° C., and plating with Ni—Sn, etc. thereon as required.

In the above-described embodiment, the first sealing substrate 31 side made of ceramic is connected and fixed to an external mounting substrate, so that mounting strength is secured, and sufficient reliability is secured against impacts and vibrations after mounting.

Further, in the embodiment described above, the capacitance c1 is formed between the outer terminal electrodes 33a and 33c of the sealing substrate 31, and a capacitance c2 is formed between the outer terminal electrodes 33b and 33c, respectively. Accordingly, two capacitances to be used in an oscillating circuit and the like are formed between the piezoelectric substrate 21 and the external mounting substrate, and connected to the outer terminal electrodes 33a, 33b, and 33c without using extra wiring. As a result, undesired floating capacitance is prevented and stable oscillation is realized.

Figure 5:
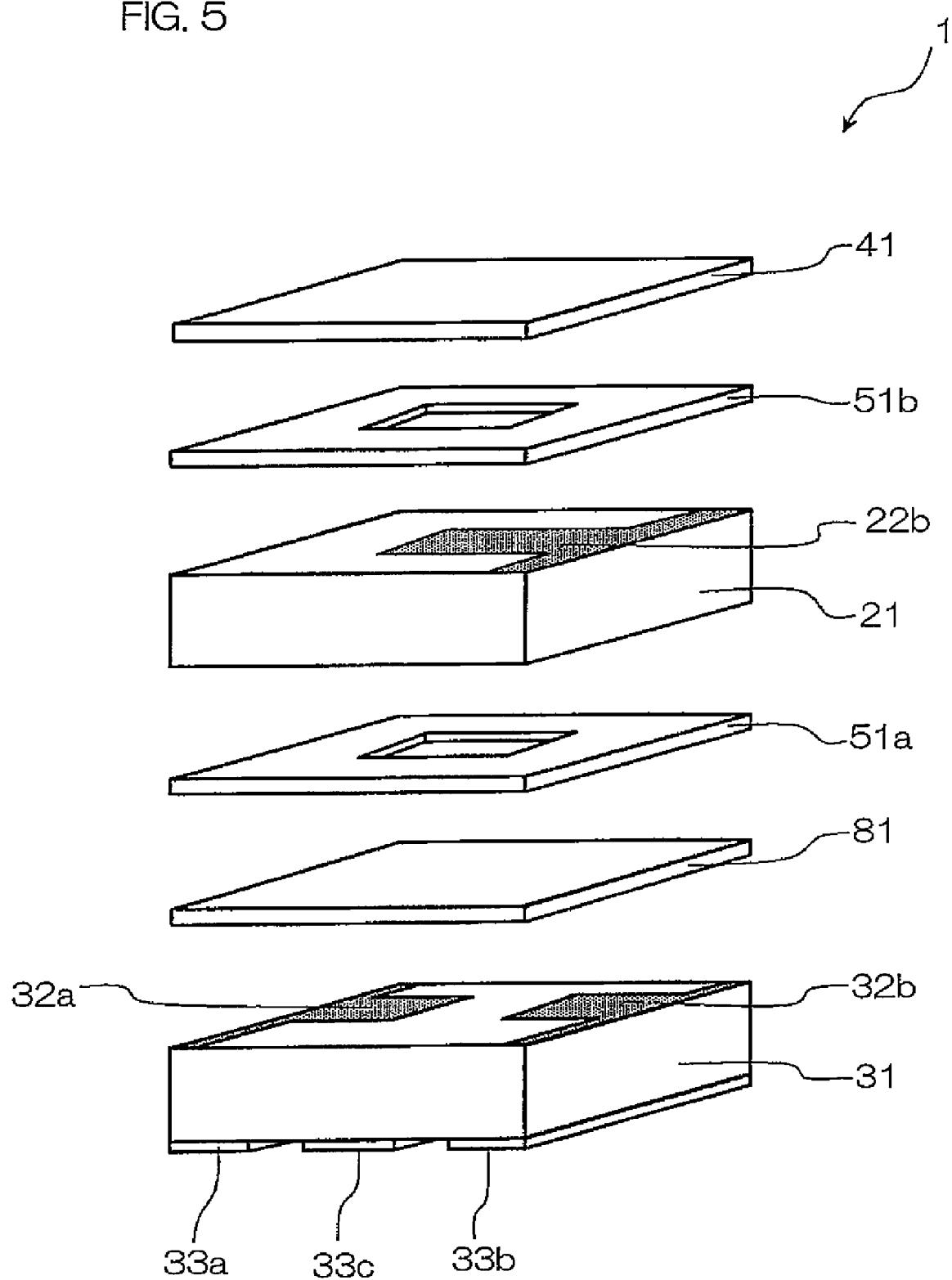
FIG. 5 is an exploded perspective view schematically showing a piezoelectric resonator of another embodiment of the present invention.

FIG. 5 is an exploded perspective view schematically showing a piezoelectric resonator of another embodiment of the present invention.

This embodiment has a feature that a resin layer 81 is inserted between the first frame 51a and the first sealing substrate 31. When the thickness of the first frame 51a is small, if the flatness of the surfaces of the piezoelectric substrate 21 and the first sealing substrate 31 is insufficient, it is difficult to compensate the insufficiency with the thickness of the first frame 51 and may cause a problem of deterioration in adhesion strength between the piezoelectric substrate 21 and the first sealing substrate 31. However, by inserting the resin layer 81 which easily deforms and has a moderate thickness between the first frame 51a and the first sealing substrate 31, the above-described problem can be effectively prevented.

The resin layer 81 is in a shape like a flat plate, and has a length and width substantially equal to those of the piezoelectric substrate 21 and the first sealing substrate 31. The thickness of the resin layer 81 is several tens of micrometers to several millimeters although it depends on the material. As the material, similarly to the second sealing substrate 41, a heat-resistant resin such as polyimide resins or epoxy resins can be used. It is preferable that glass fibers are contained in the resin layer 81. By using polyimide resins or epoxy resins containing glass fibers, thermal deformation is suppressed, and the vibration spaces 61a and 61b can be easily formed. For example, polyimide resins sheet or epoxy resins sheet with a glass fiber content of 30 to 80% is preferably used.

Herein, it is preferable that the resin layer 81 is made of the same resin material as that of the second sealing substrate 41, and the thickness of the second sealing substrate 41 and the thickness of the resin layer 81 are set to be substantially equal to each other. Accordingly, the degrees of absorbing a stress from the outside are approximated to each other between the resin layer 81 and the second sealing substrate 41, so that the stresses applied to the upper and lower surfaces of the piezoelectric substrate 21 become substantially uniform. As a result, undesired distortion of the piezoelectric substrate 21 is prevented, and excellent electrical characteristics of the piezoelectric resonator 1 can be maintained.

The present invention is not limited to the above-described embodiments, and can be variously modified and altered without departing from the spirit of the present invention.

For example, in the above-described embodiment, the frames 51a and 51b are made of a thermosetting resin such as epoxy resins, and are coated by thick-film printing. However, similarly to the first sealing substrate 41 and the resin layer 81, the frames may be made of polyimide resins or epoxy resins containing glass fibers. In this case, a resin sheet containing glass fibers formed with an opening for securing the vibrating space 61a or 61b at the center of the sheet is used and bonded by heating and pressing, and is satisfactorily joined by holding the sheet for 40 to 90 minutes at a temperature of 180 to 200° C. for curing under a pressure of 0.2 MPa to 5 MPa in vacuum of 100 Pa or less.

Herein, by using resin materials similar to each other to form the second frame 51b and the sealing substrate 41, fitting of these is improved and the joining strength between these can be improved.

Figure 6:
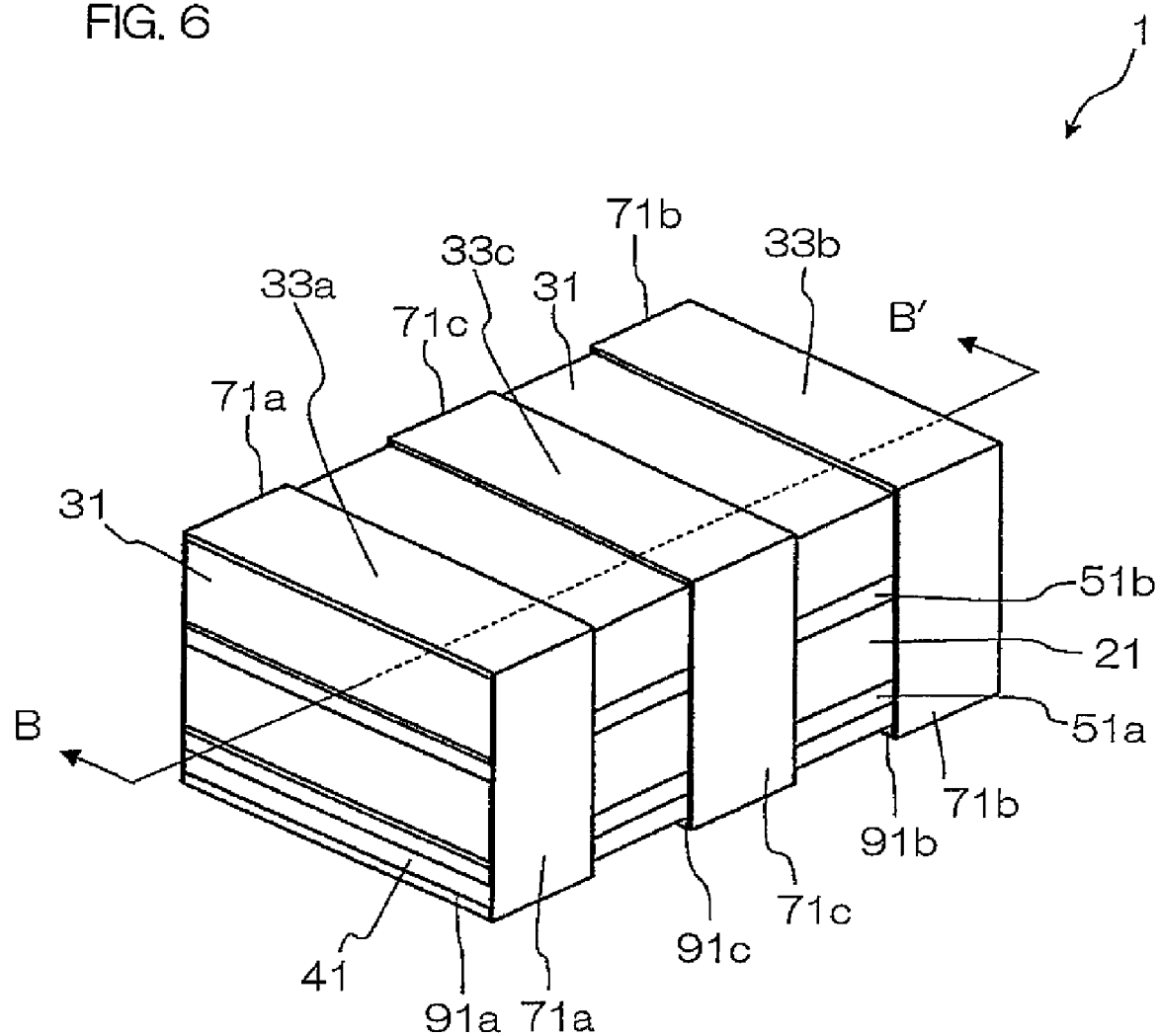
FIG. 6 is an external perspective view schematically showing a variation of the piezoelectric resonator of the present invention.
Figure 7:
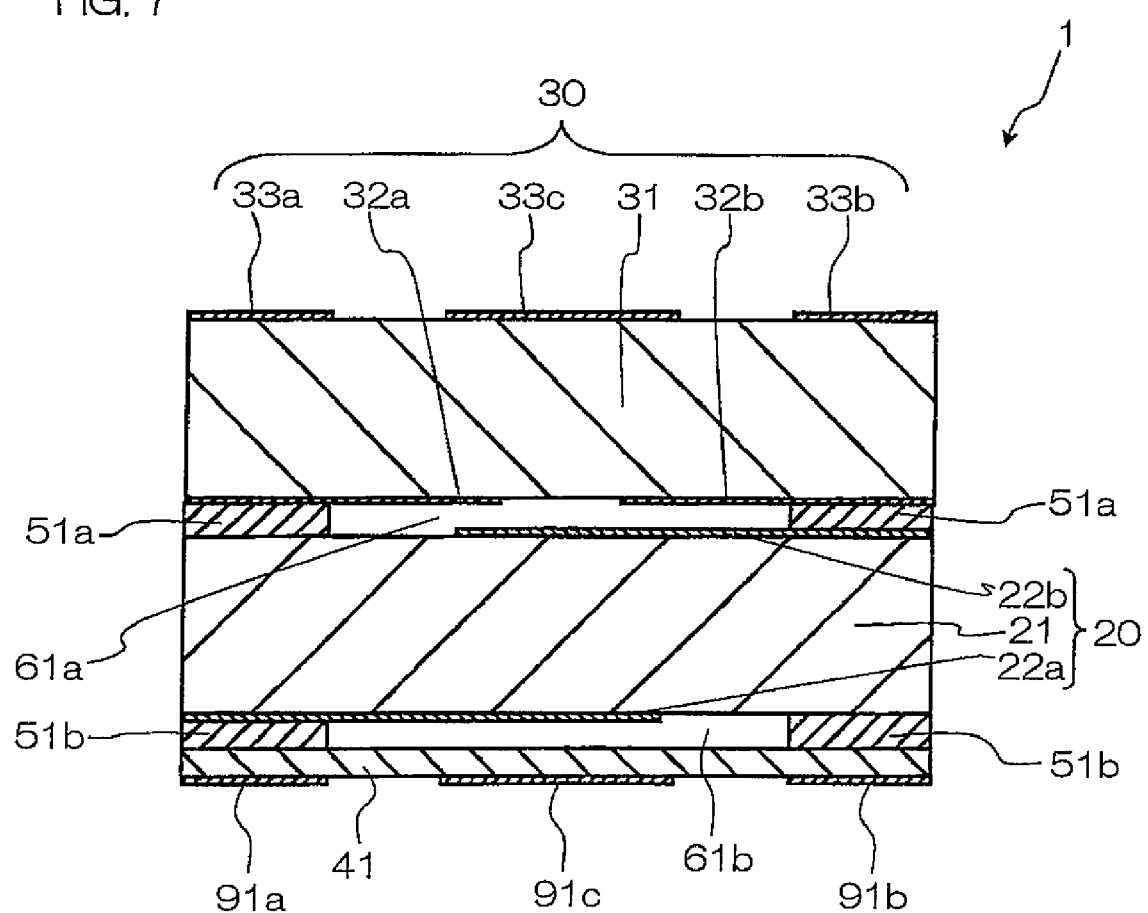
FIG. 7 is a sectional view along the B-B' line of FIG. 6.
Figure 8:
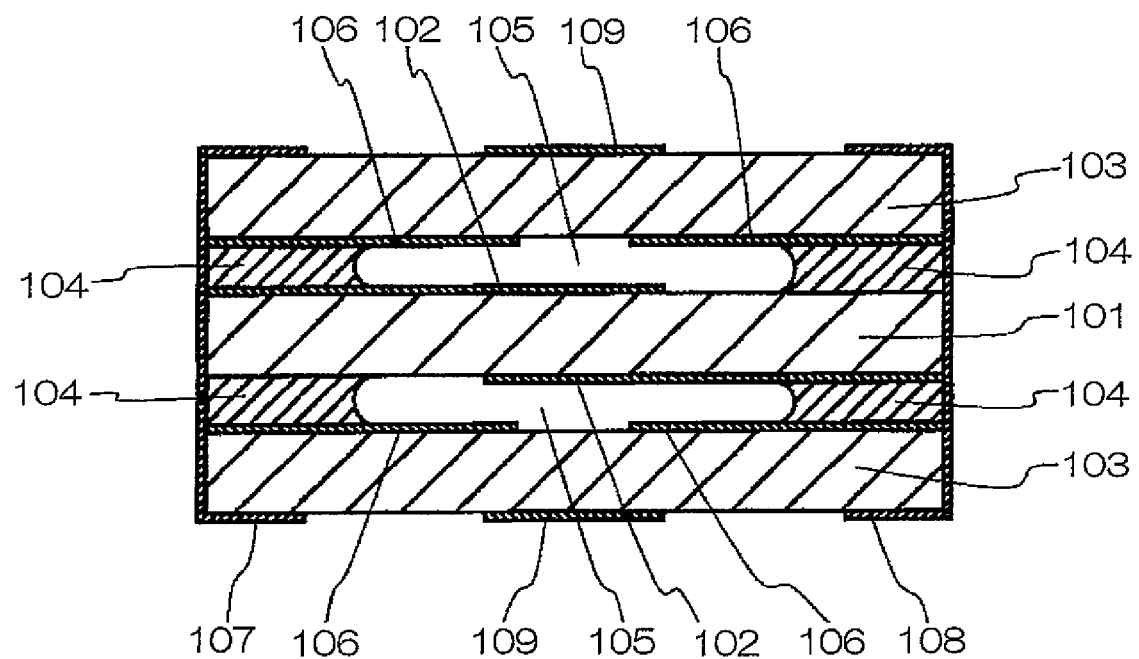
FIG. 8 is a sectional view schematically showing a conventional piezoelectric resonator.

In the piezoelectric resonators of the embodiments described above, the first sealing substrate 31 side made of ceramic is connected and fixed to an external mounting substrate. However, as shown in FIG. 6 and FIG. 7, the second sealing substrate 41 side made of a resin material may be defined as a mounting surface to be connected and fixed to the mounting substrate. FIG. 6 is an external perspective view showing a variation of the piezoelectric resonator of the present invention, and FIG. 7 is a sectional view along the B-B' line of the same.

In the piezoelectric resonator 1 shown in FIG. 6 and FIG. 7, second outer terminal electrodes 91a, 91b, and 91c to be used for connection and fixation to an external mounting substrate are formed on the lower surface of the second sealing substrate 41. The second outer terminal electrode 91a is connected to the vibrating electrode 22a, the inner electrode 32a, and the outer terminal electrode 33a by means of the outer connecting electrode 71a, the second outer terminal electrode 91b is connected to the vibrating electrode 22b, the inner electrode 32b, and the outer terminal electrode 33b by means of the outer connecting electrode 71b, and further, the outer connecting electrode 91c is connected to the outer terminal electrode 33c by means of the outer connecting electrode 71c.

The second outer terminal electrodes 91a, 91b, and 91c are formed of the same material and the same forming method as those of the outer terminal electrodes 31a, 31b, and 31c.

In the piezoelectric resonator 1 shown in FIG. 6 and FIG. 7, the second sealing substrate 41 side made of a resin material that is soft and easily deforms is defined as a mounting surface to be mounted on an external mounting substrate. As a result, a stress caused at mounting due to differences in the thermal expansion coefficient and elastic modulus from the mounting substrate is absorbed by deformation of the second sealing substrate 41, and generation of cracks or the like around the mounting surface can be effectively prevented.

The invention claimed is:

1. A piezoelectric resonator comprising:
 a piezoelectric substrate having first and second principal surfaces;
 a first vibrating electrode formed on a first principal surface of the piezoelectric substrate;
 a second vibrating electrode formed on a second principal surface of the piezoelectric substrate;
 a first sealing substrate joined to the piezoelectric substrate via a first frame so as to form a first vibration space on a first principal surface side of the piezoelectric substrate;
 a second sealing substrate joined to the piezoelectric substrate via a second frame so as to form a second vibration space on a second principal surface side of the piezoelectric substrate, and
 a resin layer is interposed between the first sealing substrate and the first frame, wherein
 the first sealing substrate is made of a ceramic material, and the second sealing substrate is made of a resin material, and
 the resin layer is made of the resin material forming the second sealing substrate, and the thickness of the second sealing substrate and a thickness of the resin layer are substantially equal to each other.

* * * * *